(12) United States Patent
Chen

(10) Patent No.: US 7,116,384 B2
(45) Date of Patent: Oct. 3, 2006

(54) METHOD FOR MANUFACTURING A PANEL OF TFT LCD HAVING PARTICULAR TFT STRUCTURE ABOVE PIXEL ELECTRODE

(75) Inventor: Hung-De Chen, Gueishan (TW)

(73) Assignee: Quanta Display Inc., Tao Yuan Shien (TW)

( * ) Notice: Subject to any disclaimer, the term of this patent is extended or adjusted under 35 U.S.C. 154(b) by 260 days.

(21) Appl. No.: 10/902,855

(22) Filed: Aug. 2, 2004

(65) Prior Publication Data

US 2005/0243230 A1    Nov. 3, 2005

(30) Foreign Application Priority Data

Apr. 30, 2004   (TW) ............................... 93112234 A (51) Int. Cl.
*G02F 1/136* (2006.01)
*H01L 21/00* (2006.01)
(52) U.S. Cl. ..................... 349/47; 349/43; 438/158
(58) Field of Classification Search ............. 349/43, 349/47, 51; 438/30
See application file for complete search history.

(56) References Cited

U.S. PATENT DOCUMENTS 7,023,021 B1 * 4/2006 Yamazaki et al. ............ 257/98

* cited by examiner

*Primary Examiner*—Andrew Schechter
*Assistant Examiner*—Lucy Chien
(74) *Attorney, Agent, or Firm*—Bacon & Thomas (57) ABSTRACT

A method for manufacturing a panel of a thin film transistor liquid crystal display device with three mask processes is disclosed. The method includes following steps: forming a transparent conductive layer, a first insulating layer, and a second metal layer on a transparent substrate in sequence; forming a source area, a drain area, a transparent electrode area, and data signal lines through a halftone photolithography and an etching; forming a semiconducting layer and a second insulating layer on the substrate in sequence; forming a semiconducting channel area in a thin film transistor area and contacts on the source area, the drain area, and the data signal lines through a photolithography and an etching; forming a third metal layer and a third insulating layer on the substrate in sequence; forming scanning signal lines and gate lines through a photolithography and an etching.

16 Claims, 10 Drawing Sheets

METHOD FOR MANUFACTURING A PANEL OF TFT LCD HAVING PARTICULAR TFT STRUCTURE ABOVE PIXEL ELECTRODE

BACKGROUND OF THE INVENTION

1. Field of the Invention

The present invention relates to a method for manufacturing a panel of a thin film transistor liquid crystal display device and, more particularly, to a method for manufacturing a panel of a thin film transistor liquid crystal display device with three mask processes.

2. Description of Related Art

Comparing with the cathode ray tube display, the liquid crystal display (LCD) has advantages on low power consumption, small occupied space, and free of irradiation. Depending on the liquid crystal operating principle, LCD device includes various specifications, which mainly classify to a passive matrix liquid crystal display (PM LCD) and a thin film transistor liquid crystal display (TFT LCD), wherein PM LCD further comprises twisted nematic (TN), super twisted nematic (STN), double layer twisted nematic (DSTN). The difference between these two specifications, the PM LCD and the TFT LCD, is about the orientation of the liquid crystal molecules affected by an electric field in the liquid crystal. The arrangement of liquid crystal molecules for the PM LCD automatically returns to the original direction while current off and then is rotated to other direction in the next recharge, so the PM LCD lacks of memory. But the arrangement of liquid crystal molecules for the TFT LCD doesn't return to the original direction while current off, so the TFT LCD can keep the memory.

When applied to a LCD TV, PM LCD, even a STN LCD, has disadvantages on low response speed and high limitation of colors. However, the TFT LCD can control the arrangement of liquid crystal molecules to induce the lights with various refractions while passing through therein. Furthermore, with combination of an orientation layer, a polarizer, or a color filter, an image can be generated with high resolution, wide view angle, high response speed, and high contrast. As a result, the TFT LCD can be applied in a field of a high-definition television (HDTV).

But the TFT LCD is still not popular in a consumer market due to the chief disadvantage on the high cost, especially the photolithography step for manufacturing a panel thereof. So how to reduce the photolithography process steps becomes the main research recently.

Therefore, it is desirable to provide an improved speech recognition method to mitigate and/or obviate the aforementioned problems.

SUMMARY OF THE INVENTION

The object of the present invention is to provide a method for manufacturing a panel of a thin film transistor liquid crystal display device with only three mask processes, which efficiently reduce the producing cost and simplify the overall process.

To achieve the object, the method for manufacturing a panel of a thin film transistor liquid crystal display device of the present invention, having a thin film transistor area and a pixel electrode area within every pixel area, which is defined by a plurality of data signal lines and scanning signal lines, includes following steps: providing a transparent substrate; forming a transparent conductive layer, a first insulating layer, and a second metal layer on the substrate in sequence; forming a source area and a drain area in the second metal layer within every thin film transistor area, forming a transparent electrode area in the transparent conductive layer within every pixel electrode area, and forming the data signal lines in the second metal layer at two peripheral sides of every pixel area through a halftone photolithography and an etching; forming a semiconducting layer and a second insulating layer on the substrate in sequence; forming a semiconducting channel area in the semiconducting layer within the thin film transistor area, and forming a plurality of contacts on the source area, the drain area, and the data signal lines through a photolithography and an etching; forming a third metal layer and a third insulating layer on the substrate in sequence; and forming the scanning signal lines, a plurality of gate lines connected with the scanning signal lines, a plurality of first connecting lines between the source area and the data signal lines, and a plurality of second connecting lines between the drain area and the transparent electrode area through a photolithography and an etching.

The method for manufacturing a panel of a thin film transistor liquid crystal display device with three mask processes preferably comprises forming a pattern of a peripheral circuit in the transparent conductive layer located around the edges of a TFT LCD panel simultaneously with forming the source area, the drain area, the transparent electrode area, and the data signal lines, wherein at least one end of the peripheral circuit is electrically connected with the data signal line or the scanning signal line and the other end of the peripheral circuit is electrically connected with an external driver for controlling the data signal lines or the scanning signal lines. The structure of the peripheral circuit connected with the data signal lines and the one connected with the scanning signal lines can be equivalent or non-equivalent. In addition, after forming a transparent conductive layer, a first metal layer is preferably formed between the transparent conductive layer and the first insulating layer for forming a channel shielding layer located in the thin film transistor area to prevent the abnormal operation of the TFT resulting from the lights transmitting from the transparent substrate. The etching for forming an undercut of the transparent conductive layer after the halftone photolithography is an over-etching, thereby the semiconducting layer and the transparent conductive layer are not connected each other in order to avoid circuit shorting. After forming the second metal layer, an n+ silicon layer is preferably formed on the surface of the second metal layer in order to form an Ohmic contact layer for the thin film transistor to enhance the operating efficiency.

The method for manufacturing a panel of a TFT LCD device may further comprises forming a plurality of capacitors to storage the signal within every pixel area, wherein the bottom plate of the capacitor is extended form the pixel electrode area, and includes the second metal layer, the first metal layer, or the combination of both the first metal layer and the second metal layer; the top plate of the capacitor comprises the third metal layer. The top plate of the capacitor may be part of the scanning signal lines in order to increase the aperture ratio of the TFT LCD. The semiconducting layer generally is an amorphous silicon layer, and a polysilicon layer is acceptable. The transparent conductive layer generally is made of indium-tin oxide (ITO) or indium-zinc oxide (IZO). The first insulating layer, the second insulating layer, and the third insulating layer preferably are made of $SiO_2$, $Si_3N_4$, and $Si(OH)_4$. The second insulating layer may be an organic insulating layer. Furthermore, the third insulating layer may be a passivation layer for preventing the TFT from moisture and scratch.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
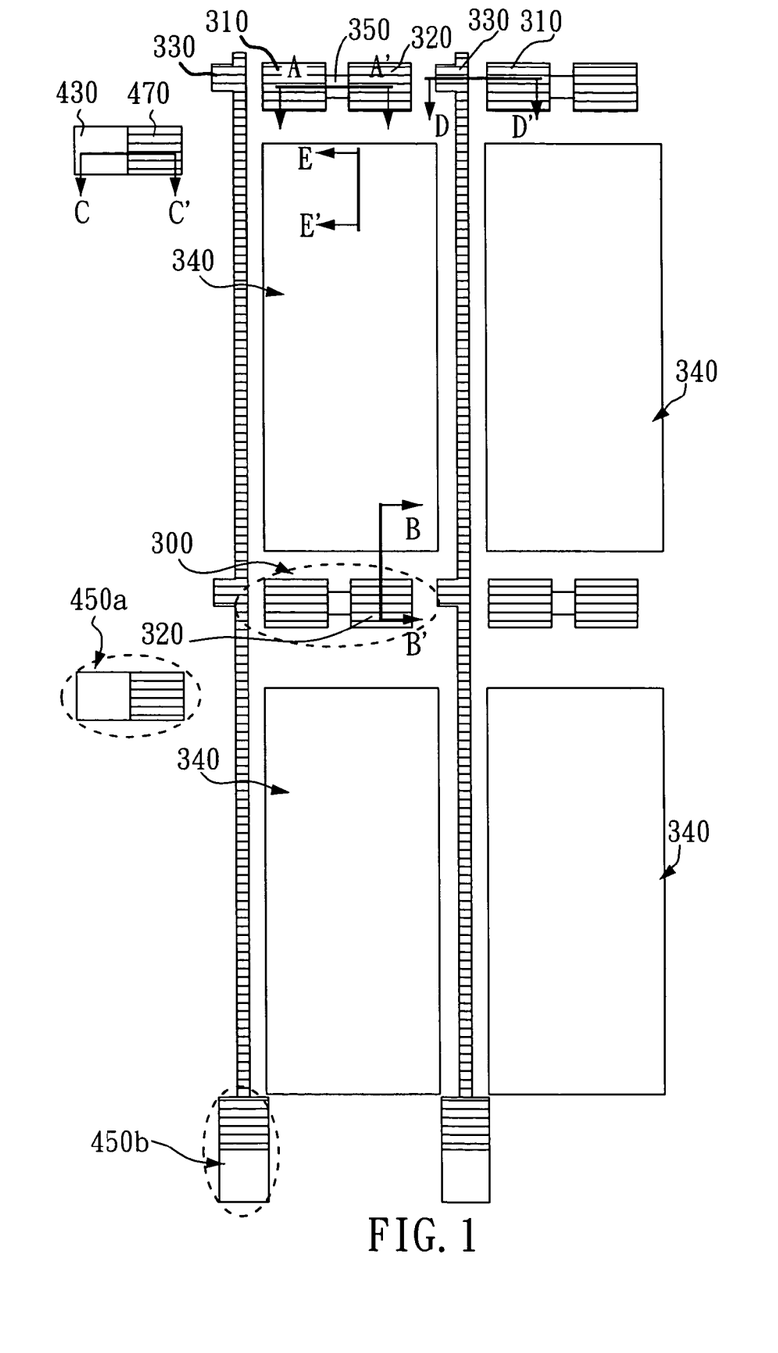
FIG. 1 is a top view of the first mask of one preferred embodiment according to the invention.
Figure 2:
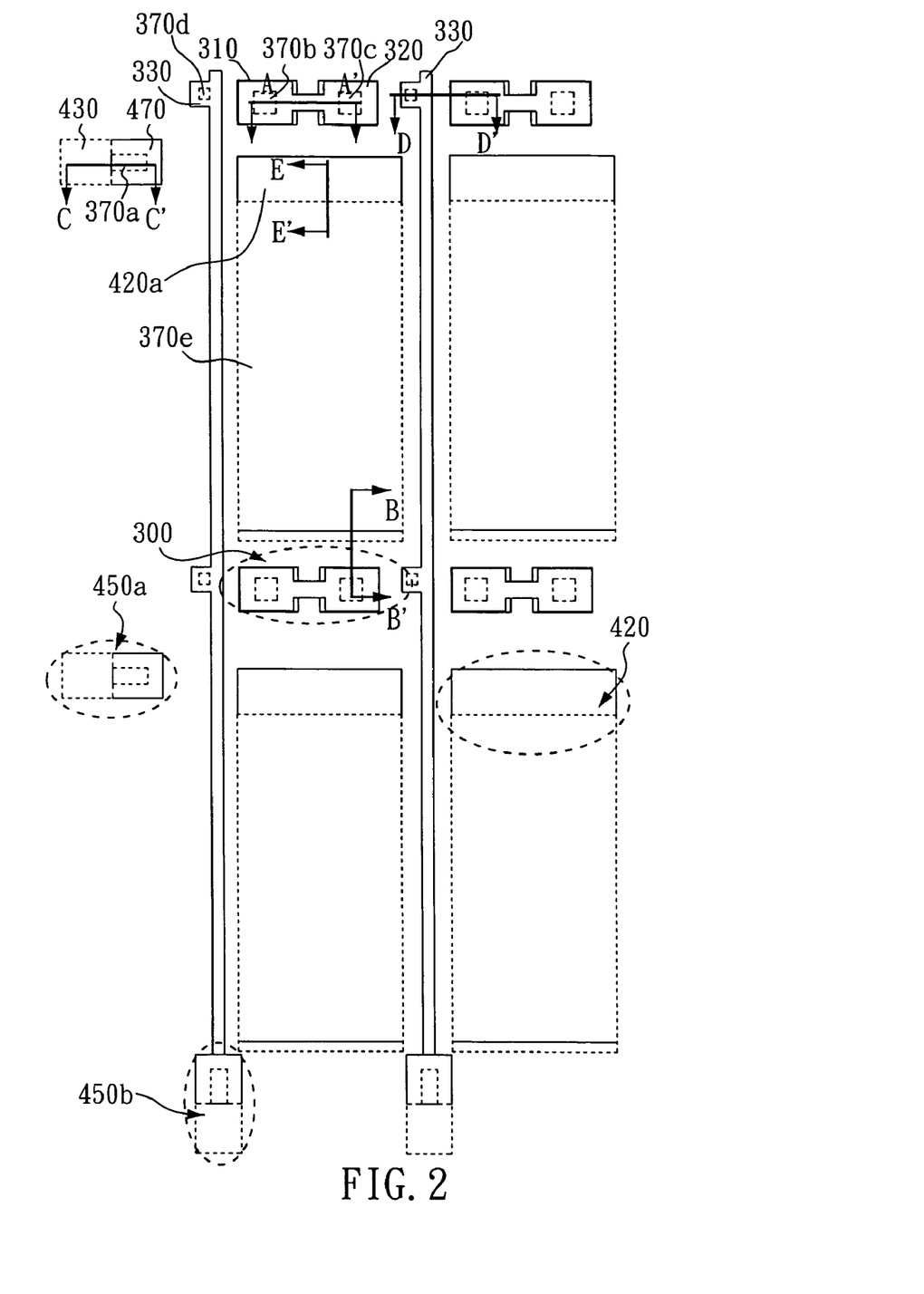
FIG. 2 is a top view of the second mask of one preferred embodiment according to the invention.
Figure 3:
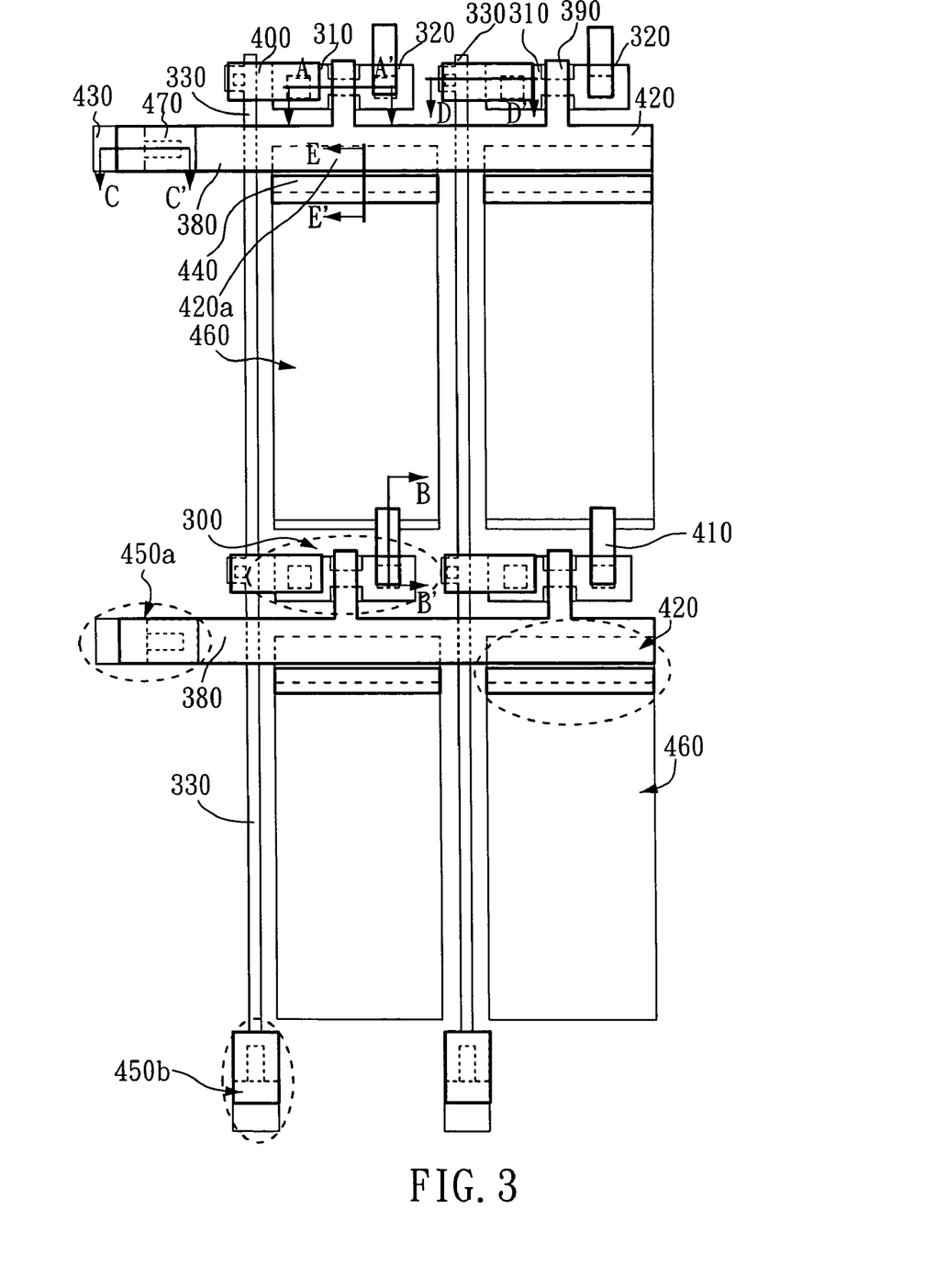
FIG. 3 is a top view of the third mask of one preferred embodiment according to the invention.

With reference to the bottom half part in FIG. 3, there is shown a thin film transistor area 300, a pixel electrode area 460, and a capacitor area 420 in every pixel area, which is surrounded by data signal lines 330 and scanning signal lines 380. In addition, a pattern of a peripheral circuit, the combination of the peripheral circuit area 450a with the peripheral circuit area 450b, is formed outside the pixel areas on the panel of the TFT LCD device. The data signal lines 330 and the scanning signal lines 380 are controlled by signals from an external driver respectively through the peripheral circuit area 450b and the peripheral circuit area 450a. In this embodiment, the structure of the peripheral circuit area 450a connected with the scanning signal lines 380 is as same as that of the peripheral circuit area 450b connected with the data signal lines 330, so the manufacturing flow of the peripheral circuit area 450b in the following description will be omitted. In the following, the line A–A' shown in FIG. 1~FIG. 3 is from the source area 310 to the drain area 320. The line B–B' shown in FIG. 1~FIG. 3 is from the drain area 320 to the pixel electrode area 460. The line C–C' shown in FIG. 1~FIG. 3 is from the peripheral circuit area 450a to the scanning signal line 380. The line D–D' shown in FIG. 1~FIG. 3 is from the data signal lines 330 to the source area 310. The line E–E' shown in FIG. 1~FIG. 3 is the profile of a top plate and a bottom plate of the capacitor area 420.

The method for manufacturing a panel of a TFT LCD device comprises following steps:

Firstly, a transparent substrate 110 is provided at step (a).

Then, a transparent conductive layer 120, a first metal layer 130, a first insulating layer 140, a second metal layer 150, and an n+ silicon layer 160 are forming on the substrate in sequence at step (b).

Figure 4A:
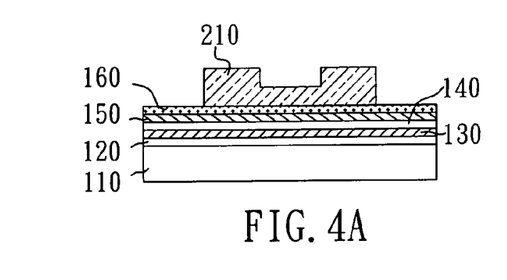
FIG. 4A is a cross-sectional view along the line A–A' after the photolithography at step (c) according to the invention.
Figure 4B:
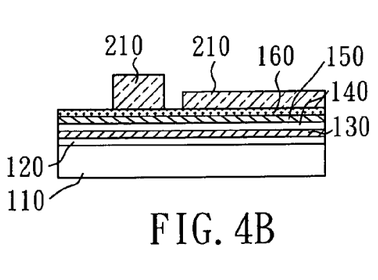
FIG. 4B is a cross-sectional view along the line B–B' after the photolithography at step (c) according to the invention.
Figure 4C:
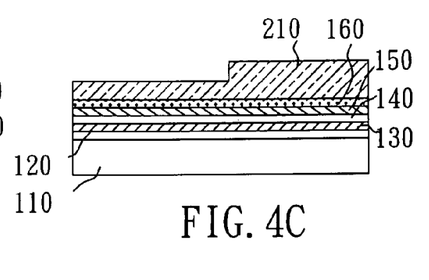
FIG. 4C is a cross-sectional view along the line C–C' after the photolithography at step (c) according to the invention.
Figure 4D:
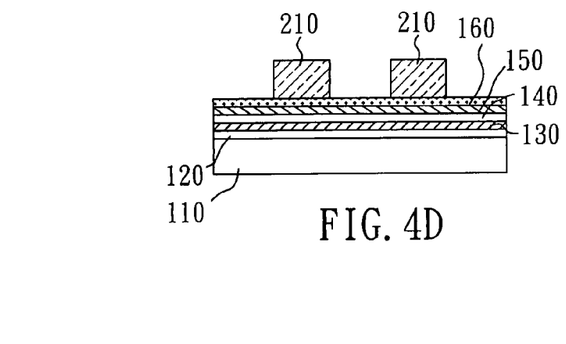
FIG. 4D is a cross-sectional view along the line D–D' after the photolithography at step (c) according to the invention.
Figure 4E:
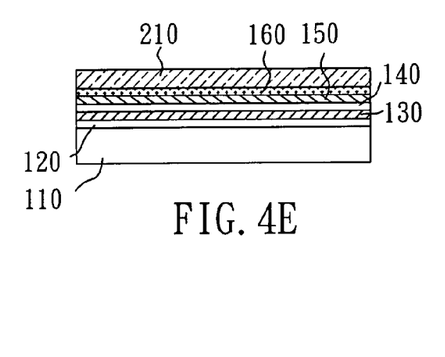
FIG. 4E is a cross-sectional view along the line E–E' after the photolithography at step (c) according to the invention.

A source area 310, a drain area 320, a plurality of channel shielding layers 350, a pixel transparent conductive area 340, data signal lines 330, and a transparent peripheral circuit 430 are defined through a halftone photolithography at step (c). With reference to FIG. 1, there is shown the halftone mask with three exposure-type sections. The section inside the blank blocks is partially exposed, such as using the mask having slot-type area, the one marked by line-filled block is not exposed, and the rest is full exposed to removed all the layer on the transparent substrate 110. After the halftone photolithography, the photoresist layer 210 for defining the source area 310, the channel shielding layers 350, and the drain area 320 along the line A–A' is formed as shown in FIG.4A, the photoresist layer 210 for defining the drain area 320 and the pixel transparent conductive area 340 along the line B–B' is formed as shown in FIG. 4B, the photoresist layer 210 for defining the transparent peripheral circuit 430 and the peripheral second metal area 470 along the line C–C' is formed as shown in FIG. 4C, the photoresist layer 210 for defining the data signal lines 330 and the source area 310 along the line D–D' is formed as shown in FIG. 4D, and the photoresist layer 210 for defining the bottom plate of the capacitor area 420 overlapping with pixel transparent conductive area 340 along the line E–E' is formed as shown in FIG. 4E, wherein the peripheral second metal area 470 within the peripheral circuit area 450a is useless but that within the peripheral circuit area 450b is an extended part from the data signal lines 330. The pixel transparent conductive area 340 is mainly taken as a pixel electrode, and the top edge thereof is taken as the bottom plate of the capacitor area 420. Both the source area 310 and the drain area 320 are over the channel shielding layers 350. The channel shielding layers 350 is almost covered all the thin film transistor area 300.

Figure 5A:
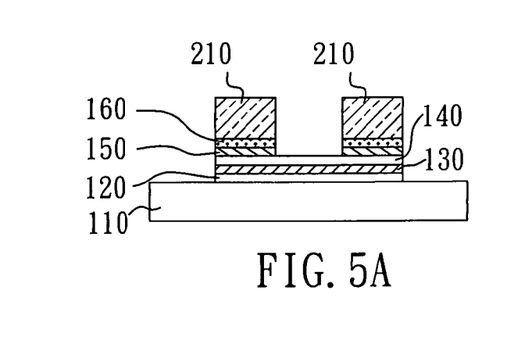
FIG. 5A is a cross-sectional view along the line A–A' during the etching at step (c) according to the invention.
Figure 5B:
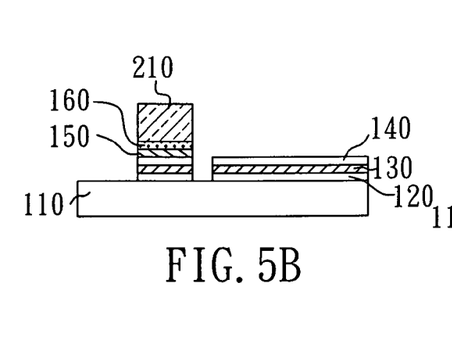
FIG. 5B is a cross-sectional view along the line B–B' during the etching at step (c) according to the invention.
Figure 5C:
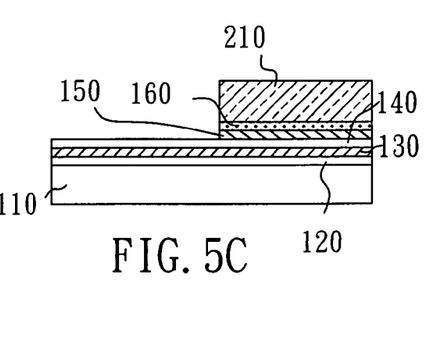
FIG. 5C is a cross-sectional view along the line C–C' during the etching at step (c) according to the invention.
Figure 5D:
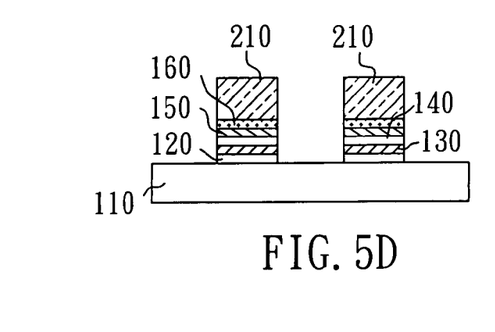
FIG. 5D is a cross-sectional view along the line D–D' during the etching at step (c) according to the invention.
Figure 5E:
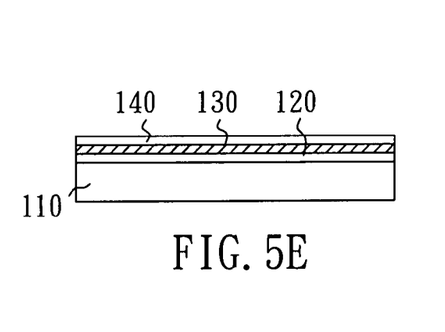
FIG. 5E is a cross-sectional view along the line E–E' during the etching at step (c) according to the invention.
Figure 6A:
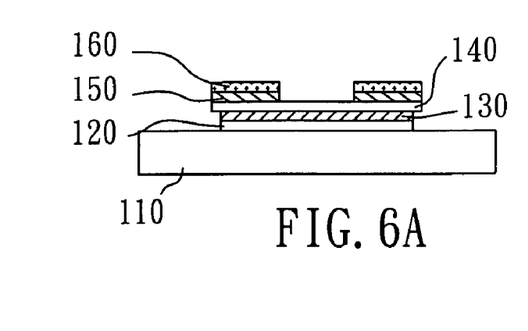
FIG. 6A is a cross-sectional view along the line A–A' after the over-etching at step (c) according to the invention.
Figure 6B:
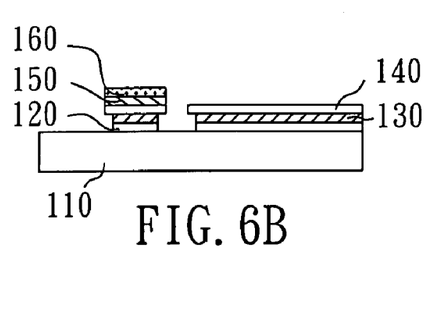
FIG. 6B is a cross-sectional view along the line B–B' after the over-etching at step (c) according to the invention.
Figure 6C:
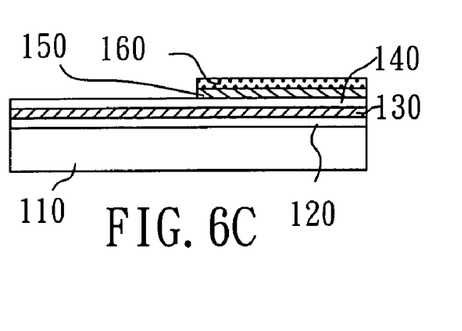
FIG. 6C is a cross-sectional view along the line C–C' after the over-etching at step (c) according to the invention.
Figure 6D:
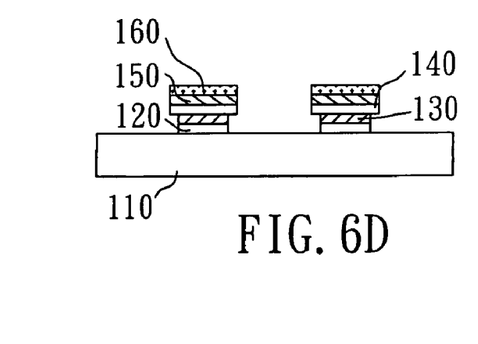
FIG. 6D is a cross-sectional view along the line D–D' after the over-etching at step (c) according to the invention.
Figure 6E:
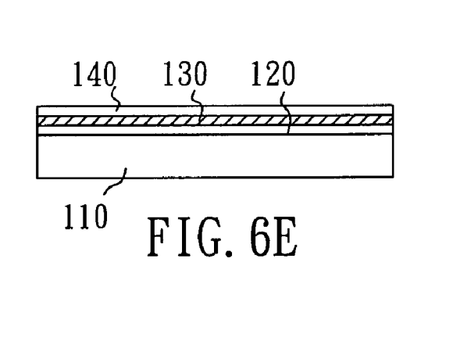
FIG. 6E is a cross-sectional view along the line E–E' after the over-etching at step (c) according to the invention.

After the etching, the source area 310 and the drain area 320 are formed in the second metal layer 150, an Ohmic contact layer is formed in the n+ silicon layer 160, and the channel shielding layer is formed in the first metal layer 130 lying on the whole thin film transistor area 300, as shown in FIG. 5A. The drain area 320 made of the second metal layer 150 and the pixel transparent conductive area 340 made of the transparent conductive layer 120 are formed, as shown in FIG. 5B. The transparent peripheral circuit 430 in the transparent conductive layer 120 is formed in the whole peripheral circuit area 450a and the peripheral second metal area 470 is left at the right hand side of the peripheral circuit area 450a in order to equalize the structures both in the peripheral circuit area 450a and in the peripheral circuit area 450b, as shown in FIG. 5C. The data signal lines 330 in the second metal layer 150 is shown at the left hand side in FIG. 5D and the source area 310 in the second metal layer 150 is shown at the right hand side in FIG. 5D. The bottom plate of the capacitor area 420 is formed by removing the second metal layer 150 and keeping the first metal layer, which is electrically connected with pixel transparent conductive area 340, as shown in FIG. 5E.

An over-etching in the transparent conductive layer 120 and the first metal layer 130 is performed for forming an undercut next. After removing the photoresist layer 210, the structures along the line A–A', line B–B', line C–C', line D–D', and line E–E' are shown in FIG. 6A, FIG. 6B, FIG. 6C, FIG. 6D, and FIG. 6E, respectively.

Both an amorphous silicon layer 170 and a second insulating layer 180 are formed on the transparent substrate 110 in sequence at step (d). Due to the undercut structure, the amorphous silicon layer 170 is not connected with both the transparent conductive layer 120 and the first metal layer 130. As a result, there is no current interaction between the transparent conductive layer 120 and the amorphous silicon layer 170.

Figure 7A:
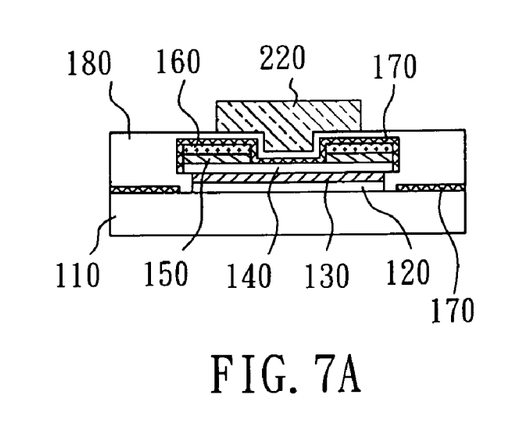
FIG. 7A is a cross-sectional view along the line A–A' after the photolithography at step (e) according to the invention.
Figure 7B:
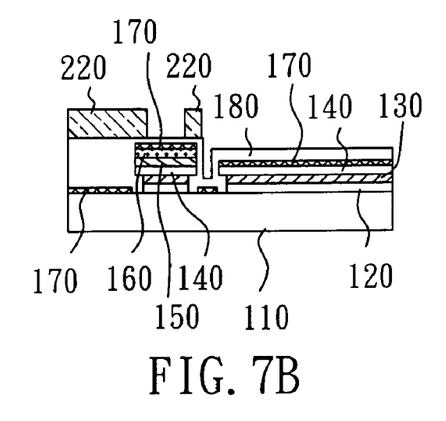
FIG. 7B is a cross-sectional view along the line B–B' after the photolithography at step (e) according to the invention.
Figure 7C:
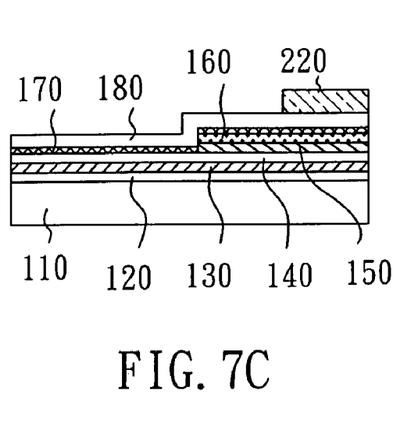
FIG. 7C is a cross-sectional view along the line C–C' after the photolithography at step (e) according to the invention.
Figure 7D:
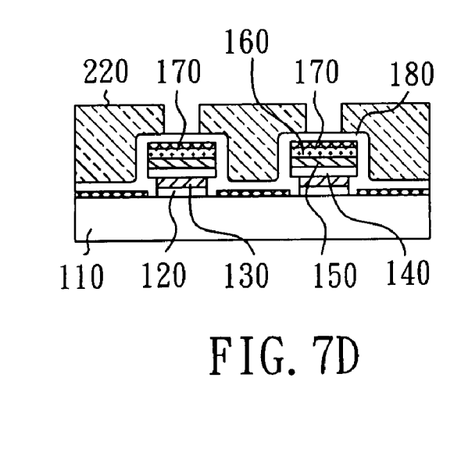
FIG. 7D is a cross-sectional view along the line D–D' after the photolithography at step (e) according to the invention.
Figure 7E:
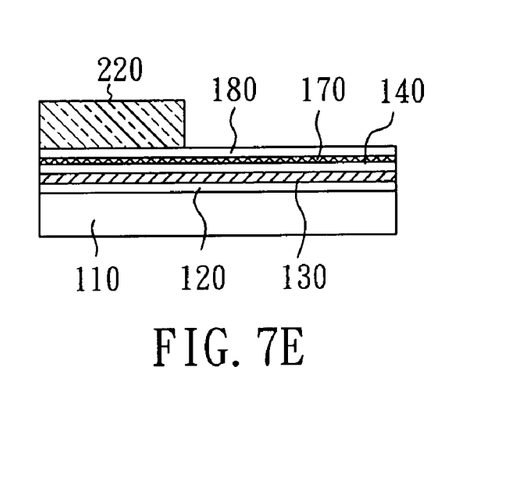
FIG. 7E is a cross-sectional view along the line E–E' after the photolithography at step (e) according to the invention.

The following step (e) is defining a plurality of contacts 370b, 370c, 370a, and 370d respectively on the source area 310, the drain area 320, the peripheral circuit area 450a, and data signal lines 330 by photolithography. An opening 370e is defined above the pixel transparent conductive area 340. All the contacts and the opening 370e are shown in the dash-line block in FIG. 2. The photoresist layer 220 for defining the contact 370b on the source area 310 and the contact 370c on the drain area 320 is formed as shown in FIG. 7A. The photoresist layer 220 for defining the contact 370c on the drain area 320 and the opening 370e on the pixel transparent conductive area 340 is formed as shown in FIG. 7B. The photoresist layer 220 for defining the contact 370a on both the transparent peripheral circuit 430 and the partial of the peripheral second metal area 470 is formed as shown in FIG. 7C. The photoresist layer 220 for defining the contact 370d on the data signal lines 330 and the contact 370b on the source area 310 is formed as shown in FIG. 7D. The photoresist layer 220 for defining the bottom plate area 420a in the amorphous silicon layer 170 of the capacitor area 420 is formed as shown in FIG. 7E.

Figure 8A:
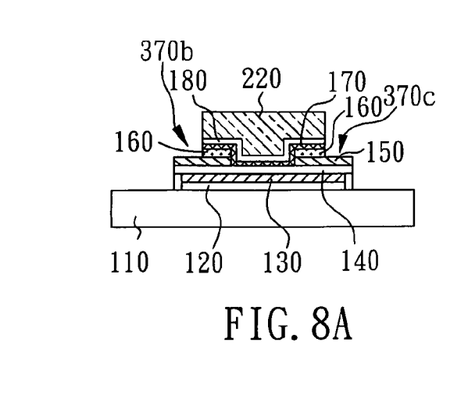
FIG. 8A is a cross-sectional view along the line A–A' after the etching at step (e) according to the invention.
Figure 8B:
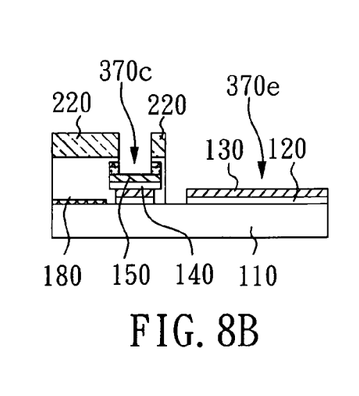
FIG. 8B is a cross-sectional view along the line B–B' after the etching at step (e) according to the invention.
Figure 8C:
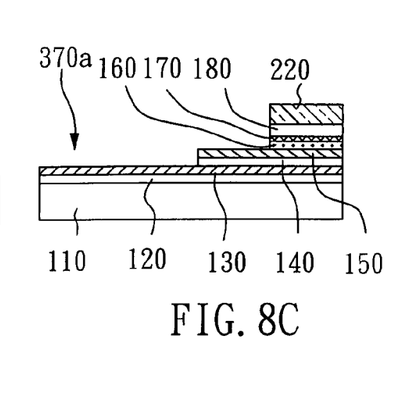
FIG. 8C is a cross-sectional view along the line C–C' after the etching at step (e) according to the invention.
Figure 8D:
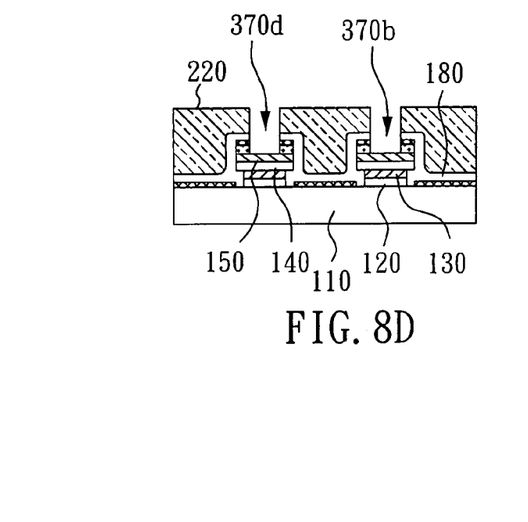
FIG. 8D is a cross-sectional view along the line D–D' after the etching at step (e) according to the invention.
Figure 8E:
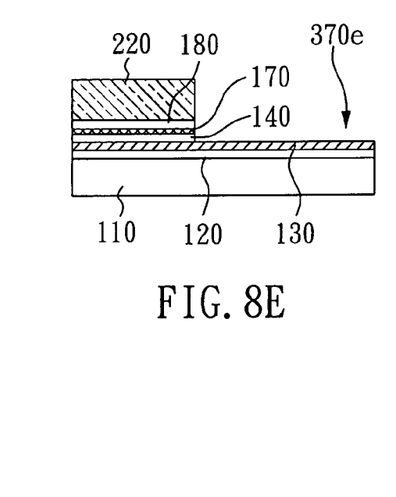
FIG. 8E is a cross-sectional view along the line E–E' after the etching at step (e) according to the invention.

After the etching, the contact 370b on the source area 310 and the contact 370c on the drain area 320 are formed as shown in FIG. 8A. A semiconducting channel area of the TFT is formed in the amorphous silicon layer 170 between the contact 370b and the contact 370c. The main remained layers on the pixel transparent conductive area 340 are the transparent conductive layer 120 and the first metal layer 130 as shown in FIG. 8B. Both the transparent peripheral circuit 430 and the partial of the peripheral second metal area 470 are exposed due to the formation of the contact 370a within the peripheral circuit area 450a as shown in FIG. 8C. The contact 370d on the data signal lines 330 and the contact 370b on the source area 310 are formed as shown in FIG. 8D. The bottom plate area 420a in the amorphous silicon layer 170 of the capacitor area 420 is formed as shown in FIG. 8E.

After removing the photoresist layer 220, a third metal layer 190 and a third insulating layer 200 are formed on the transparent substrate in sequence at step (f).

Figure 9A:
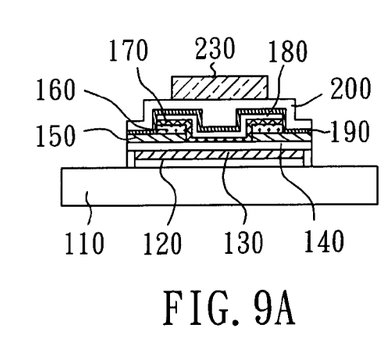
FIG. 9A is a cross-sectional view along the line A–A' after the photolithography at step (g) according to the invention.
Figure 9B:
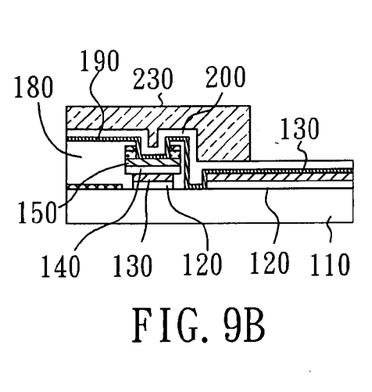
FIG. 9B is a cross-sectional view along the line B–B' after the photolithography at step (g) according to the invention.
Figure 9C:
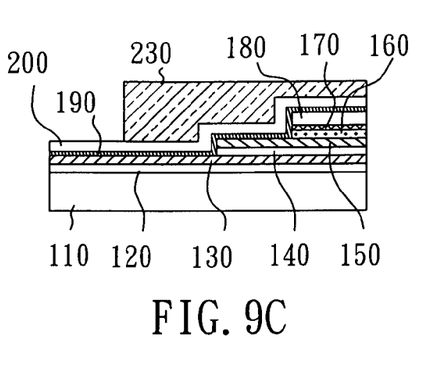
FIG. 9C is a cross-sectional view along the line C–C' after the photolithography at step (g) according to the invention.
Figure 9D:
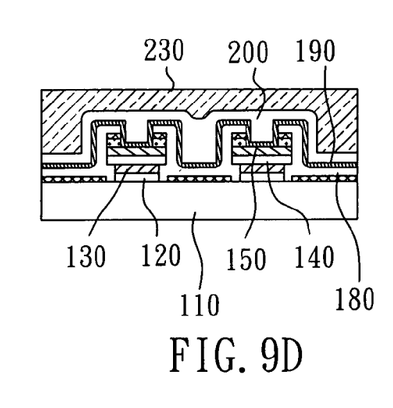
FIG. 9D is a cross-sectional view along the line D–D' after the photolithography at step (g) according to the invention.
Figure 9E:
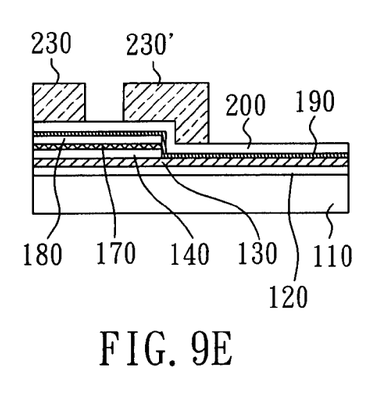
FIG. 9E is a cross-sectional view along the line E–E' after the photolithography at step (g) according to the invention.

With reference to FIG. 3, there is shown the mask pattern in bold-line block for forming the scanning signal lines 380, a plurality of gate lines 390 connected with the scanning signal lines 380, a plurality of first connecting lines 400 between the source area 310 and the data signal lines 330, a plurality of second connecting lines 410 between the drain area 320 and the pixel transparent conductive area 340, and a plurality of third connecting lines 440 for connected both the first metal layer 130 and the amorphous silicon layer 170 within the capacitor area 420, wherein the pixel transparent conductive area 340 is approximately combined the capacitor area 420 with the pixel electrode area 460. To go into detail, the photoresist layer 230 for defining the gate lines 390 of the TFT is shown in FIG. 9A. The photoresist layer 230 for defining the second connecting lines 410 between the drain area 320 and the pixel transparent conductive area 340 is shown in FIG. 9B. The photoresist layer 230 for defining the scanning signal lines 380 with one end electrically connected to the transparent peripheral circuit 430 through the first metal layer 130 is shown in FIG. 9C. The photoresist layer 230 for defining the first connecting line 400 between the source area 310 and the data signal line 330 is shown in FIG. 9D. The photoresist layer 230 for defining the top plate in the capacitor area 420, the part of scanning signal lines 380, is shown at left hand side in FIG. 9E. The photoresist layer 230' for defining the third connecting lines 440 for connected both the first metal layer 130 and the amorphous silicon layer 170 within the capacitor area 420 is shown at right hand side in FIG. 9E.

Figure 10A:
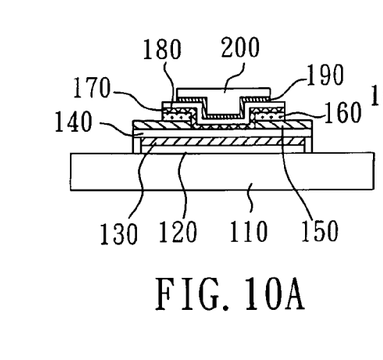
FIG. 10A is a cross-sectional view along the line A–A' after the etching at step (g) according to the invention.
Figure 10B:
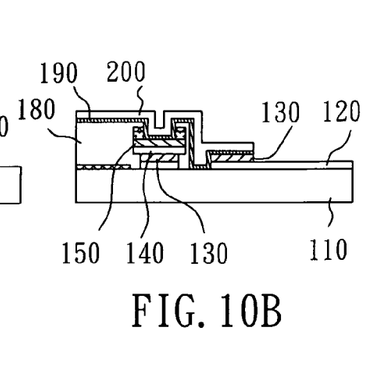
FIG. 10B is a cross-sectional view along the line B–B' after the etching at step (g) according to the invention.
Figure 10C:
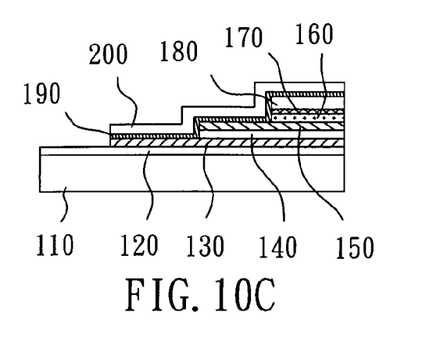
FIG. 10C is a cross-sectional view along the line C–C' after the etching at step (g) according to the invention.
Figure 10D:
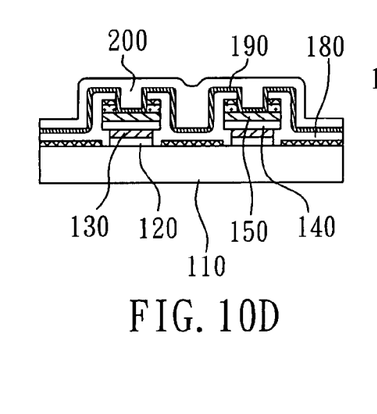
FIG. 10D is a cross-sectional view along the line D–D' after the etching at step (g) according to the invention.
Figure 10E:
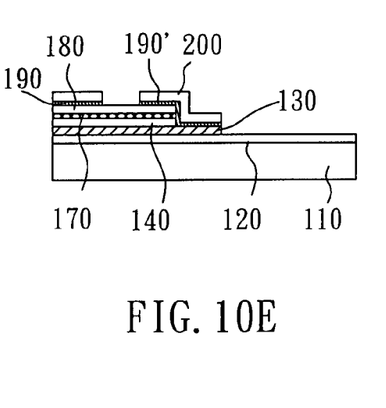
FIG. 10E is a cross-sectional view along the line E–E' after the etching at step (g) according to the invention.

Finally, after etching and removing the photoresist layer 230, a TFT is formed in the thin film transistor area 300, of which the structure includes the Ohmic contact layer in the n+ silicon layer 160, the semiconducting channel area in the amorphous silicon layer 170, the source area 310 and the drain area 320 in the second metal layer 150, the gate line 390 in the second metal layer 190, and the channel shielding layer in the first metal layer 130 as shown in FIG. 10A. The structure along the drain area to the pixel electrode area 460 is shown in FIG. 10B. The second metal layer 150 in the drain area 320 is electrically connected with the transparent conductive layer 120 in the pixel electrode area 460 through the second connecting lines 410. The structure of the peripheral circuit area 450a is shown in FIG. 10C. The transparent peripheral circuit 430 in the transparent conductive layer 120 is electrically connected with the scanning signal lines 380 in the third metal layer 190 through the first metal layer 130. Furthermore, the scanning signal lines 380 in the third metal layer 190 is also connected with the peripheral second metal area 470. If the structure shown in FIG. 10C is in peripheral circuit area 450b, the peripheral second metal area 470 is connected with one end of the data signal lines 330. As a result, the transparent peripheral circuit 430 can control the signal of the data signal lines 330 through the first metal layer 130 and the third metal layer 190. The structure from the data signal line 330 to the source area 310 is shown in FIG. 10D. The data signal line 330 is connected with the source area 310 through the first connecting line 400 in the third metal layer 190. The structure of the capacitor area 420 is shown in FIG. 10E. All components of the bottom plate, the transparent conductive layer 120, the amorphous silicon layer 170, and the first metal layer 130, are electrically connected one another through the third connecting lines 440 in the third metal layer 190', so all the components are with the same electric potential. The top plate in the capacitor area 420 is part of scanning signal lines 380 in the third metal layer 190.

In this embodiment, the method for manufacturing a panel of a TFT LCD device having a TFT and a pixel electrode can be achieved by using only three mask processes, so this will efficiently reduce the producing cost and simplify the overall process.

Although the present invention has been explained in relation to its preferred embodiment, it is to be understood that many other possible modifications and variations can be made without departing from the spirit and scope of the invention as hereinafter claimed.

What is claimed is:

1. A method for manufacturing a panel of a thin film transistor liquid crystal display device, which has a thin film transistor area and a pixel electrode area within every pixel area defined by a plurality of data signal lines and scanning signal lines, comprising following steps:
  (a) providing a transparent substrate;
  (b) forming a transparent conductive layer, a first insulating layer, and a second metal layer on the transparent substrate in sequence;
  (c) forming a source area and a drain area in the second metal layer within every thin film transistor area, forming a transparent electrode area in the transparent conductive layer within every pixel electrode area, and forming the data signal lines in the second metal layer at two peripheral sides of every pixel area through a halftone photolithography and an etching;
  (d) forming a semiconducting layer and a second insulating layer on the transparent substrate in sequence;
  (e) forming a semiconducting channel area in the semiconducting layer within the thin film transistor area, and forming a plurality of contacts on the source area, the drain area, and the data signal lines through a photolithography and an etching;
  (f) forming a third metal layer and a third insulating layer on the transparent substrate in sequence; and
  (g) forming the scanning signal lines, a plurality of gate lines connected with the scanning signal lines, a plurality of first connecting lines between the source area and the data signal lines, and a plurality of second connecting lines between the drain area and the pixel electrode area through a photolithography and an etching.

2. The method as claimed in claim 1, further comprising forming a first metal layer between the transparent conductive layer and the first insulating layer at step (b) in order to form a channel shielding layer located in the thin film transistor area at step (c).

3. The method as claimed in claim 1, further comprising forming a pattern of a peripheral circuit of the transparent conductive layer at step (c), wherein at least one end of the peripheral circuit is electrically connected with the data signal line or the scanning signal line after step (g).

4. The method as claimed in claim 3, wherein the data signal lines or the scanning signal lines are controlled by signals from an external driver through the pattern of the peripheral circuit.

5. The method as claimed in claim 1, wherein the etching at step (c) further comprises forming an undercut of the transparent conductive layer through an over-etching, thereby the semiconducting layer and the transparent conductive layer are not connected each other at step (d).

6. The method as claimed in claim 1, further comprising forming an n+ silicon layer on a surface of the second metal layer at step (b) in order to form an Ohmic contact layer for the thin film transistor.

7. The method as claimed in claim 1, further comprising forming a bottom plate of a capacitor having the second metal layer and the transparent conductive layer within every pixel area at step (c), and forming a top plate of the capacitor having the third metal layer at step (g).

8. The method as claimed in claim 2, further comprising forming a bottom plate of a capacitor having the first metal layer and the transparent conductive layer within every pixel area at step (c), and forming a top plate of the capacitor having the third metal layer at step (g).

9. The method as claimed in claim 7, wherein the capacitor is at one side of the scanning signal line in order to increase the aperture ratio of the TFT LCD.

10. The method as claimed in claim 8, wherein the capacitor is at one side of the scanning signal line in order to increase the aperture ratio of the TFT LCD.

11. The method as claimed in claim 1, wherein the semiconducting layer is an amorphous silicon layer.

12. The method as claimed in claim 1, wherein the transparent conductive layer is made of ITO or IZO.

13. The method as claimed in claim 1, wherein the second insulating layer is made of $SiO_2$, $Si_3N_4$, and $Si(OH)_4$.

14. The method as claimed in claim 1, wherein the second insulating layer is an organic insulating layer.

15. The method as claimed in claim 1, wherein the third insulating layer is made of $SiO_2$, $Si3N_4$, and $Si(OH)_4$.

16. The method as claimed in claim 1, wherein the third insulating layer is a passivation layer.

* * * * *